United States Patent [19]

Harshbarger

[11] 4,000,428
[45] Dec. 28, 1976

[54] ELECTRONIC SWITCH
[75] Inventor: John H. Harshbarger, Xenia, Ohio
[73] Assignee: Visual Information Institute, Inc., Xenia, Ohio
[22] Filed: June 2, 1975
[21] Appl. No.: 583,199
[52] U.S. Cl. .............................. 307/254; 307/241; 307/237; 307/255
[51] Int. Cl.² ....................................... H03K 17/00
[58] Field of Search .......... 307/241, 243, 255, 235, 307/237

[56] References Cited
UNITED STATES PATENTS

| | | | |
|---|---|---|---|
| 3,181,008 | 4/1965 | Huckins | 307/235 A |
| 3,230,397 | 1/1966 | Linder | 307/243 |
| 3,350,571 | 10/1967 | Moulton et al. | 307/241 |
| 3,665,220 | 5/1972 | Legler et al. | 307/254 |

Primary Examiner—Stanley D. Miller, Jr.
Assistant Examiner—B. P. Davis
Attorney, Agent, or Firm—Melvin A. Crosby

[57] ABSTRACT

An electronic switch in which first, second and third transistors are arranged in a group and provide for switching signals from a supply thereof to a signal buss. The source of signals is supplied to the base of the first transistor and from the emitter thereof to the base of the third transistor. The emitter of the third transistor is connected to the signal buss. The second transistor is connected between the signal path leading from the emitter of the first transistor to the base of the third transistor to ground and is controlled as to conductivity by the selective supply of voltage signals to the base thereof. The signal path from the source of signals to the signal buss is characterized in extremely low impedance when the switch is 'ON' and in extremely high impedance when the switch is 'OFF', with the switch operating between on and off conditions extremely rapidly.

6 Claims, 2 Drawing Figures

ELECTRONIC SWITCH

The present invention relates to an electronic switch arrangement, particularly characterized in a high impedance condition when OFF and a low impedance condition when ON and in extreme rapidity of operation.

Electronic switches of the nature referred to are particularly useful for selectively placing independently generated signals on a common output line. For example, in television testing, a multiburst signal is commonly employed. Such a signal consists of a series of independently generated sine wave bursts, all phase locked to the synchronizing pulse of the television circuit. Ordinarily, the basic sine wave information is developed by a synchronized oscillator and is present throughout the complete television line. The electronic switch of the present invention is employed for inserting the sine wave information on a common signal buss. Thus, a plurality of sources of sine wave information can selectively be supplied to a common signal buss for insertion of the information on a television line, as may be desired.

A problem that is always encountered in connection with switching in television circuitry and the like is the speed in which the switching can be accomplished and, furthermore, the efficiency of the switching, namely, the ratio of switch ON to switch OFF impedance.

At the switching speeds required, transistor switching is indicated but it is often the case that at least one of the extremely low impedance of a switch in ON condition and the extremely high impedance of a switch in OFF position is not ideally achieved.

The switching arrangement of this invention solves the problems referred to above and provides for extremely rapid switching while, at the same time, establishing extremely low impedance for signal flow when the switch is ON, and establishing extremely high impedance when the switch is OFF.

BRIEF SUMMARY OF THE INVENTION

According to the present invention, a transistorized switching circuit is provided in which a first transistor, which may be a PNP transistor, has a voltage source and a resistor in series connected to the emitter thereof, while the collector may be connected to a voltage source of opposite polarity. The signals to be transmitted are supplied to the base of the transistor and the conduction of the transistor is thereby varied and the emitter end of the resistor varies in potential due to the voltage drop in the resistor.

A connection is taken from the emitter end of the resistor to the base of another transistor which, in this case, may be an NPN transistor. A source of voltage is connected to the collector of the last mentioned transistor, while a signal buss connected to a resistive load is connected to the emitter thereof.

A further transistor has the collector-emitter path connected between the emitter of the first mentioned transistor and ground and is controlled between conductive and nonconductive states by the selective supply of positive and negative voltage signals to the base thereof.

In operation, when the last mentioned transistor is in nonconductive state there is substantially unimpeded flow of signals from the signal source to the signal buss. However, when the last mentioned transistor goes conductive, the supply of signals to the signal buss is impeded by extremely high impedance.

Furthermore, when the transistor connected to the signal buss goes to nonconduction, another transistor, in another switch group, and connected to the signal buss goes to conduction, thereby further back biasing the transistor of the first group which is connected to the signal buss and greatly increasing the efficiency of the operation of the electronic switch.

The exact nature of the present invention and the objects and advantages thereof will be more apparent upon reference to the following drawings, in which.

DETAILED DESCRIPTION OF THE INVENTION

Figure 1:
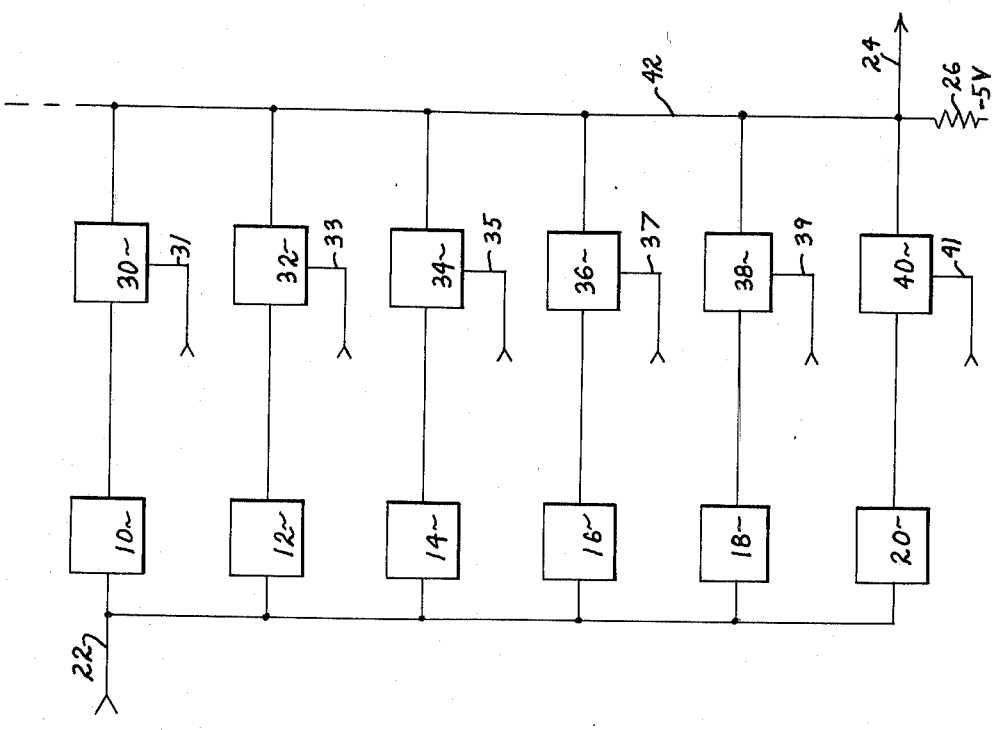
FIG. 1 is a typical circuit arrangement utilizing electronic switches according to the present invention.

Referring to the drawings somewhat more in detail, FIG. 1 shows a plurality of burst oscillators at 10 to 20, each oscillating at a respective frequency. Each oscillator has a control terminal and connected to the control terminals of the oscillators is a wire 22 by means of which the oscillators are turned ON and OFF. Wire 22 represents the synchronizing input and may be supplied by the synchronizing pulse which occurs at the end of each television line.

The oscillators are provided for supplying signals to an output wire 24 which has one end of a resistance 26 connected thereto, with the other end of the resistance connected to a minus five volts source. The end of resistance 26 which is connected to wire 24 is also connected to the output terminal of a plurality of switches indicated at 30 to 40 and each having the input side connected to the output side of the respective one of oscillators 10 to 20. Each switch has a control terminal connected by a respective wire 31 to 41 to a respective source of control pulses.

In the arrangement illustrated in FIG. 1, all of the oscillators start and stop at the same time as determined by the supply of control signals on wire 22. The switches 30 to 40, however, are selectively controlled so that only one thereof at any time is supplying a signal burst to the signal buss, or output wire, 42 which is connected to output wire 24.

Figure 2:
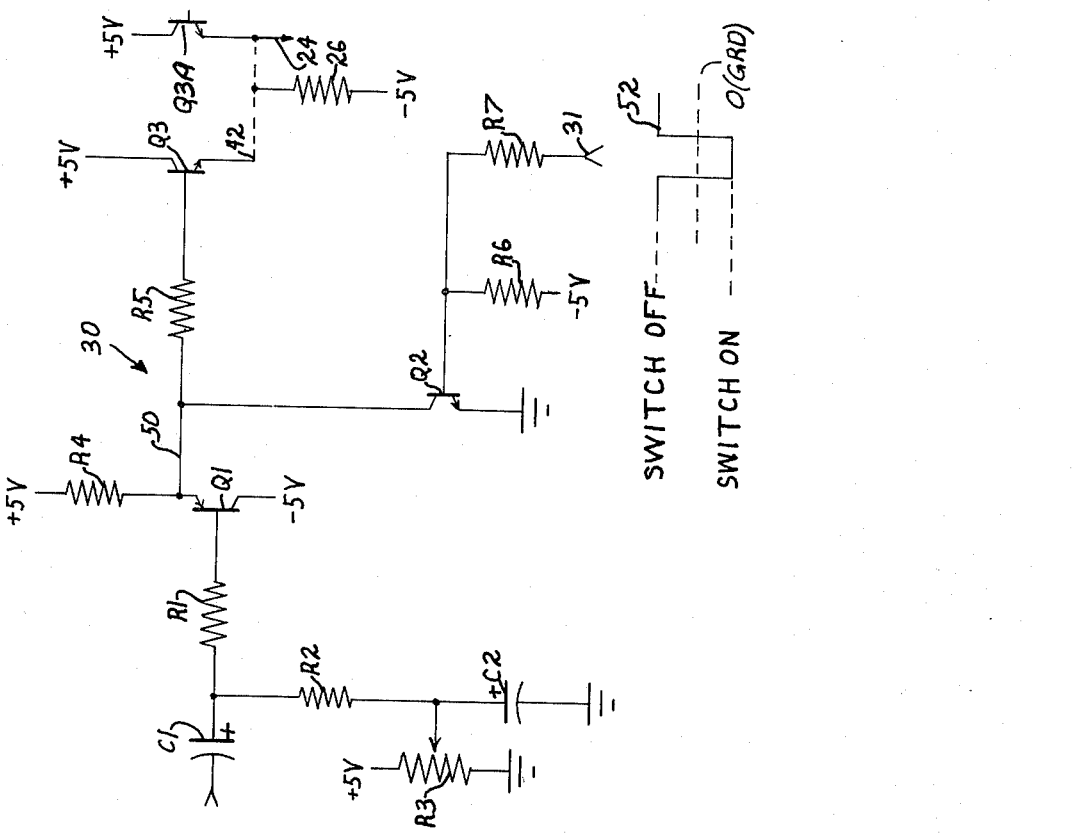
FIG. 2 is a detailed schematic representation of an individual switch.

FIG. 2 shows in detail the make up of each of the aforementioned switches. In FIG. 2, the switch 30 is illustrated but it will be understood that each of the other switches is constructed in the same manner, although capacitor values in the circuit may be changed to account for different frequencies at the signal input side.

In FIG. 2, the signal input is at the left hand side of the view and is supplied through the capacitor C1 and a resistor R1 to the base of a first PNP transistor Q1. The capacitor side of resistor R1 is connected through resistor R2 and a capacitor C2 to ground, while the capacitor end of resistor R2 is connected to the slider of a voltage divider, or potentiometer, R3, which has one end connected to a plus five source and the other end grounded.

A plus five source is connected through a resistor R4 to the emitter of transistor Q1, while the collector is connected to a minus five volt source. A wire 50 leads from the emitter of transistor Q1 through a resistor R5 to the base terminal of an NPN transistor Q3 and, likewise, to the emitter terminal to a still further NPN transistor Q2. The collector of transistor Q2 is connected to ground.

The base terminal of transistor Q2 is connected to a minus five volt source via a resistor R6 and via a resistor R7 to the respective control terminal 31 of the switch and to which pulses are supplied to control the conductivity of the switch. A typical pulse, as indicated at 52, in FIG. 2, and is marked to show that the switch is OFF when the pulse is positive and is ON when the pulse goes negative.

Transistor Q3 has the collector connected to a five volt source, while the emitter is connected to wire 42 forming the signal buss, previously referred to, which, in turn, is connected to output wire 24 and via the load resistor 26 to a minus five volts source.

Each of the several switches has an output transistor corresponding to transistor Q3 of switch 30 connected to wire 42. For example, in FIG. 2, the transistor Q3A is connected to the signal buss in the same manner as transistor Q3. Transistor Q3A may pertain, for example, to switch 32.

In operation, the bias voltage at the base of transistor Q1 is controlled by the use of the potentiometer represented by resistor R3, bypass capacitor C2, and base resistor R2, whereby to maintain a positive output d. c. level at the emitter of Q3.

When a signal is to be passed through the switch, transistor Q2 is driven to nonconduction by back biasing thereof by way of the supply of a minus signal to the base thereof. For all practical purposes, transistor Q2, when thus back biased, can be considered to be completely out of the circuit and, accordingly, the signal appearing at the emitter of Q1 is transmitted directly through resistor R5 to the base of the output transistor Q3, the emitter of which feeds the common emitter follower load resistor identified by reference numeral 26.

As mentioned, all of the output emitter followers of the several switches of the circuit are connected to the common buss load resistor 26. When the signal through a respective switch is to be blocked by the switch going to OFF condition, the respective control transistor Q2 is driven to saturation by supplying a positive voltage signal through resistor R7 to the base terminal of the transistor. When transistor Q2 goes to saturation, the collector to emitter impedance thereof is substantially zero. The emitter voltage of transistor Q1 is also pulled down substantially to zero, thereby back biasing the emitter to base junction of transistor Q1. This causes transistor Q1 also to go substantially to nonconduction.

At the same time, the voltage at the base of transistor Q3 is reduced substantially to zero and this tends to reduce the emitter voltage of transistor Q3 to slightly below the saturation voltage of transistor Q2, as determined by the forward bias base to emitter voltage of transistor Q3.

At this time, however, another of the output transistors of the array of switches illustrated in FIG. 1 becomes effective for supplying signals to the signal buss 42 and this signal supply tends to increase the voltage at the upper end of resistor 26 to a positive level. This causes the base to emitter junction of transistor Q3 to go to a back biased condition and transistor Q3 thereby becomes substantially completely nonconductive.

The operation of the switches in practice has proved to approach an ideal switching condition. When a switch is ON, the signal is passed directly through the switch with a minimum amount of loss, indicating extremely low switch impedance. In the OFF state, however, the signal encounters extremely high impedance in the back biased junction of Q1, a near zero impedance to ground in the saturated condition of transistor Q2, and another high impedance in the back biased junction of transistor Q3. It has been found that the switch in OFF condition interrupts the signal so completely that measurement of a rejection ratio at frequencies under 10 megahertz is not possible.

The resistors shown at R1 and R5 in the circuit have proved advantageous in connection with the suppression of extremely high oscillations, say, on the order of 100 megahertz, and which oscillation may occur in emitter follower circuits, utilizing high speed transistors. Resistors R1 and R5 are otherwise substantially without function in respect of the operation of the illustrated circuit.

Modifications may be made within the scope of the appended claims.

What is claimed is:

1. In an electronic switch arrangement for controlling the flow of signals from respective sources thereof to a common signal buss; a switch interposed between each signal source and said common buss, each said switch comprising first, second and third transistors each having base, collector and emitter terminals, a respective said source being connected to the base terminal of each said first transistor, a source of voltage and a resistor in series in the collector-emitter path of each said first transistor, a connection which leads from a point on one of each said collector-emitter path and the respective resistor which varies in potential as the respective first transistor varies in conductivity to the base terminal of the respective said third transistor and via the collector-emitter path of the respective said second transistor to ground, a second source of voltage and a said common signal buss serially connected in the collector-emitter path of each said third transistor, and means for selectively supplying positive and negative voltage signals to the base terminals of said second transistor to turn the respective said switches off and on.

2. An electronic switch according to claim 1 in which each said first transistor is a PNP transistor and the respective said resistor is connected between the emitter terminal of each said first transistor and said first source of voltage, each said connection being connected to the emitter of the respective first transistor, each said third transistor being a NPN transistor, said second source of voltage being connected to the collector terminal of each said third transistor, and said common signal buss comprising a resistance load and being connected to the emitter terminals of said third transistors.

3. An electronic switch according to claim 1 in which said second transistor is an NPN transistor.

4. An electronic switch according to claim 1 in which each said source of signals is an oscillator, each oscillator oscillating at a respective frequency.

5. An electronic switch according to claim 1 which includes a respective source of voltage signals connected to the base terminal of each second transistor, each said source of signals comprising an oscillator oscillating at a respective frequency, a control input common to said oscillators to turn the oscillators on and off, and a resistor connected between said signal buss and a third source of voltage which is opposite in polarity to that of said second source of voltage.

6. An electronic switch according to claim 5 in which each first transistor is a PNP transistor, and each second and third transistor is an NPN transistor, each of said first and second sources of voltage being of positive polarity and said third source of voltage being of negative polarity.

* * * * *